United States Patent
Lee

(10) Patent No.: US 8,493,793 B2
(45) Date of Patent: Jul. 23, 2013

(54) NONVOLATILE MEMORY DEVICE AND ERASURE METHOD THEREOF

(75) Inventor: Wook Hyoung Lee, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 171 days.

(21) Appl. No.: 13/191,656

(22) Filed: Jul. 27, 2011

(65) Prior Publication Data
US 2012/0069677 A1    Mar. 22, 2012

(30) Foreign Application Priority Data

Sep. 20, 2010    (KR) .......................... 10-2010-0092587

(51) Int. Cl.
*G11C 16/16*      (2006.01)
*G11C 16/3404*    (2006.01)
*G11C 16/3413*    (2006.01)

(52) U.S. Cl.
USPC ............ 365/185.22; 365/185.24; 365/185.28; 365/185.29; 365/135.3

(58) Field of Classification Search
None
See application file for complete search history.

(56) References Cited

U.S. PATENT DOCUMENTS

| | | | |
|---|---|---|---|
| 5,898,620 A * | 4/1999 | Grosshans | 365/185.29 |
| 5,991,203 A * | 11/1999 | Choi | 365/185.27 |
| 5,991,206 A * | 11/1999 | Shin | 365/185.29 |
| 6,137,729 A * | 10/2000 | Choi | 365/185.29 |
| 6,285,584 B1 * | 9/2001 | Ahrens et al. | 365/185.05 |
| 6,421,277 B2 | 7/2002 | Tsunesada | |
| 6,452,837 B2 | 9/2002 | Mori et al. | |
| 6,493,266 B1 | 12/2002 | Yachareni et al. | |
| 6,507,522 B2 | 1/2003 | Lee et al. | |
| 6,567,302 B2 * | 5/2003 | Lakhani | 365/185.03 |
| 6,831,864 B2 | 12/2004 | Mizoguchi et al. | |
| 6,842,378 B2 * | 1/2005 | Chang | 365/185.22 |
| 6,967,873 B2 | 11/2005 | Hamilton et al. | |
| 7,050,336 B2 | 5/2006 | Tomoeda et al. | |
| 7,230,853 B2 | 6/2007 | Kwon et al. | |
| 7,558,122 B2 | 7/2009 | Kim et al. | |
| 7,852,680 B2 * | 12/2010 | Kuo | 365/185.22 |

FOREIGN PATENT DOCUMENTS

| | | |
|---|---|---|
| CN | 1591688 | 3/2005 |
| CN | 101241760 | 8/2008 |
| JP | 2001-283595 | 10/2001 |
| KR | 1019980055941 | 9/1998 |

(Continued)

*Primary Examiner* — Tan T. Nguyen
(74) *Attorney, Agent, or Firm* — F. Chau & Associates, LLC

(57) ABSTRACT

A method in performing an erasure operation of a nonvolatile memory device includes a step of performing a block erasure operation wherein a plurality of memory cells in a selected block are erased at once, a step of selecting an over-programmed memory cell having a threshold voltage higher than an upper bound verification voltage, and a step of erasing selectively the over-programmed memory cell. A nonvolatile memory device comprises a cell array comprising a plurality of memory cells wherein the memory cells have a desired threshold voltage distribution for a state of being erased, wherein the distribution spreads over between a lower bound verification voltage and an upper bound verification voltage, a voltage generator configured to provide a word line voltage and a bit line voltage to word lines and bit lines of the plurality of memory cells respectively, a write driver and sense amplifier configured to write data or read out data through bit lines of the plurality of memory cells, and a control logic configured to control the voltage generator and the write driver and sense amplifier to perform a post-erasure operation of selecting and erasing an over-programmed memory cell having a threshold voltage higher than the upper bound verification voltage.

20 Claims, 15 Drawing Sheets

FOREIGN PATENT DOCUMENTS

| | | |
|---|---|---|
| KR | 1020010011482 | 2/2001 |
| KR | 1020010098374 | 11/2001 |
| KR | 1020020036273 | 5/2002 |
| KR | 1020050024248 | 3/2005 |
| KR | 1020060008589 | 1/2006 |
| KR | 1020060092238 | 8/2006 |
| KR | 1020080056970 | 6/2008 |
| TW | I283869 | 7/2007 |

* cited by examiner

Fig. 8

|  | SL | Sel. WL | Sel. BL | Bulk |
|---|---|---|---|---|
| (a) Pre-program | GND | 5~10V | 3~5V | 0V(or NV) |
| (b) Block erase | Floating | -10V | Floating | 6~10V |
| (c) Post-program | GND | 2~3V | 3~5V | 0V(or NV) |
| (d) Post-erase | Floating | -10V | 5V | 0V |

|  | SL | Sel. WL | Sel. BL | Bulk |
|---|---|---|---|---|
| (a) Pre-program | GND | 5~10V | 3~5V | 0V(or -1V) |
| (b) Block erase | Floating | -10V | Floating | 6~10V |
| (c) Post-erase | Floating | -10V | 5V | 0V |
| (d) Post-program | GND | 2~3V | 3~5V | 0V(or -1V) |

NONVOLATILE MEMORY DEVICE AND ERASURE METHOD THEREOF

CROSS-REFERENCE TO RELATED APPLICATIONS

This U.S. non-provisional patent application claims priority under 35 U.S.C. §119 of Korean Patent Application No. 10-2010-0092587, filed on Sep. 20, 2010, the contents of which are hereby incorporated by reference.

TECHNICAL FIELD

The present inventive concept herein relates to semiconductor memory devices, and more particularly, to a nonvolatile memory device and an erasure method of the nonvolatile memory device.

DISCUSSION OF RELATED ART

Semiconductor memory devices are classified into volatile memory devices and nonvolatile memory devices. The volatile memory devices have a high read/write speed but have a disadvantage of losing their stored data when their power supplies are interrupted. The nonvolatile memory devices retain their stored data even when their power supplies are interrupted. Thus, the nonvolatile memory devices may be used to store data which should be preserved regardless of whether power supplies are supplied or not.

Flash memory devices among nonvolatile memory devices have a high integration compared with conventional EEPROMs and thereby they are applied to an auxiliary memory device of high capacity. A multi-level cell (MLC) structure may further increase memory capacity. Accordingly, a threshold voltage distribution of memory cells after an erasure operation is desired to have a sensing margin for a read operation of non-volatile memory devices using MLC structure.

SUMMARY

In an embodiment of the inventive concept, a method in performing an erasure operation of a nonvolatile memory device comprises a step of performing a block erasure operation wherein a plurality of memory cells in a selected block are erased at once, a step of selecting an over-programmed memory cell having a threshold voltage higher than an upper bound verification voltage, and a step of erasing selectively the over-programmed memory cell.

In a further embodiment of the inventive concept, the step of erasing selectively the over-programmed memory cell includes applying a negative high voltage to a word line of the selected memory cell and a positive high voltage to a bit line of the selected memory cell so that electrons stored in a floating gate of the over-programmed memory cell are pulled off to a drain of the over-programmed memory cell. A source line of the selected memory cell is in a floating state.

In a further embodiment of the inventive concept, the method in performing an erasure operation of a nonvolatile memory device further comprises a step of selecting an over-erased memory cell having a threshold voltage lower than a lower bound verification voltage and a step of programming the over-erased memory cell before the step of erasing selectively the over-programmed memory cell. The upper bound verification voltage corresponds to an erasure verification voltage used in the step of performing a block erasure operation. The step of selecting an over-programmed memory cell further comprises a step of verifying the plurality of memory cells using the upper bound verification voltage. The step of erasing selectively the over-programmed memory cell further comprises a step of verifying that the over-programmed memory cell has a threshold voltage equal to or less than the upper bound verification voltage wherein the step of erasing selectively the over-programmed memory cell repeats until the over-programmed memory cell has a threshold voltage equal to or lower than the upper bound verification voltage.

In a further embodiment of the inventive concept, the method in performing an erasure operation of a nonvolatile memory device further comprises a step of selecting an over-erased memory cell having a threshold voltage lower than a lower bound verification voltage and a step of programming the over-erased memory cell after the step of erasing selectively the over-programmed memory cell. A verification voltage of the block erasure operation is higher than the upper verification voltage. The step of erasing selectively the over-programmed memory cell further comprises a step of verifying that the over-programmed memory cell has a threshold voltage equal to or less than the upper bound verification voltage wherein the step of erasing selectively the over-programmed memory cell repeats until the over-programmed memory cell has a threshold voltage equal to or lower than the upper bound verification voltage.

In a further embodiment of the inventive concept, the method in performing an erasure operation of a nonvolatile memory device further comprises a step of pre-programming the selected memory cells before the step of performing a block erasure operation.

In an embodiment of the inventive concept, a nonvolatile memory device comprises a cell array comprising a plurality of memory cells wherein the memory cells have a desired threshold voltage distribution for a state of being erased, wherein the distribution spreads over between a lower bound verification voltage and an upper bound verification voltage, a voltage generator configured to provide a word line voltage and a bit line voltage to word lines and bit lines of the plurality of memory cells respectively, a write driver and sense amplifier configured to write data or read out data through bit lines of the plurality of memory cells, and a control logic configured to control the voltage generator and the write driver and sense amplifier to perform a post-erasure operation of selecting and erasing an over-programmed memory cell having a threshold voltage higher than the upper bound verification voltage.

In a further embodiment of the inventive concept, the post-erasure operation is performed, the control logic controls the voltage generator and the write driver and sense amplifier so that a negative high voltage is applied to a word line of the over-programmed memory cell and a positive high voltage is applied to the bit line of the over-programmed memory cell. The control logic further controls the voltage generator and the write driver and sense amplifier so that a source line of the over-programmed memory cell is set to be in a floating state and a voltage of 0V or a negative voltage is applied to a bulk region of the over-programmed memory cell.

In an embodiment of the inventive concept, a nonvolatile memory device comprises a memory cell array comprising a plurality of memory cells wherein the memory cells have a desired threshold voltage distribution for a state of being erased, wherein the distribution spreads over between a lower bound verification voltage and an upper bound verification voltage, a voltage generator configured to supply bias voltages for an erasure operation of the memory cells, and a control logic configured to control the voltage generator and to perform the erasure operation including a pre-program operation, a post-program operation, and a two-step erasure operation so that the memory cells have the desired threshold voltage distribution for a state of being erased.

In a further embodiment of the inventive concept, the two-step erasure operation includes a block erasure operation and a post-erasure operation wherein for the block erasure operation, the control logic sets the voltage generator to erase memory cells in a selected block by a F-N tunneling erasure mechanism and for an over-programmed memory cell having the upper bound verification voltage, the control logic sets the voltage generator to selectively erases the over-programmed memory cell by a negative gate drain side erasure mechanism. The erasure operation is performed in a sequence of the pre-program operation, the block erasure operation, the post-program operation, and the post-erasure operation. The controller logic further performs a verifying operation using a reference voltage higher than the upper bound verification voltage for the block erasure operation.

In a further embodiment of the inventive concept, the erasure operation is performed in a sequence of the pre-program operation, the block erasure operation, the post-erasure operation, and the post-program operation. The controller logic further performs a verifying operation using a reference voltage equal to the upper bound verification voltage for the block erasure operation.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. The thickness of layers and regions are exaggerated for clarity. In the drawings:

FIG. 8 is a table illustrating a bias condition in the erasure method in accordance with the first embodiment of the inventive concept.

DETAILED DESCRIPTION OF THE EMBODIMENTS

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Hereinafter, a NOR type flash memory device will be used as an example of a nonvolatile memory device to describe a technical feature and a function of the inventive concept. However, the technical feature and the function of the inventive concept is not limited to a NOR type flash memory device. The technical feature and the function of the inventive concept may be applied to all the memory devices using a reference cell. For example, the nonvolatile memory device of the inventive concept may be a phase change random access memory (PRAM) or a resistance memory such as a resistance random access memory (RRAM). The nonvolatile memory device may also be a memory device using any one of memory devices such as a nano floating gate memory (NFGM), a polymer random access memory (PoRAM), a magnetic random access memory (NFGM), a ferroelectric random access memory (FRAM).

Figure 1:
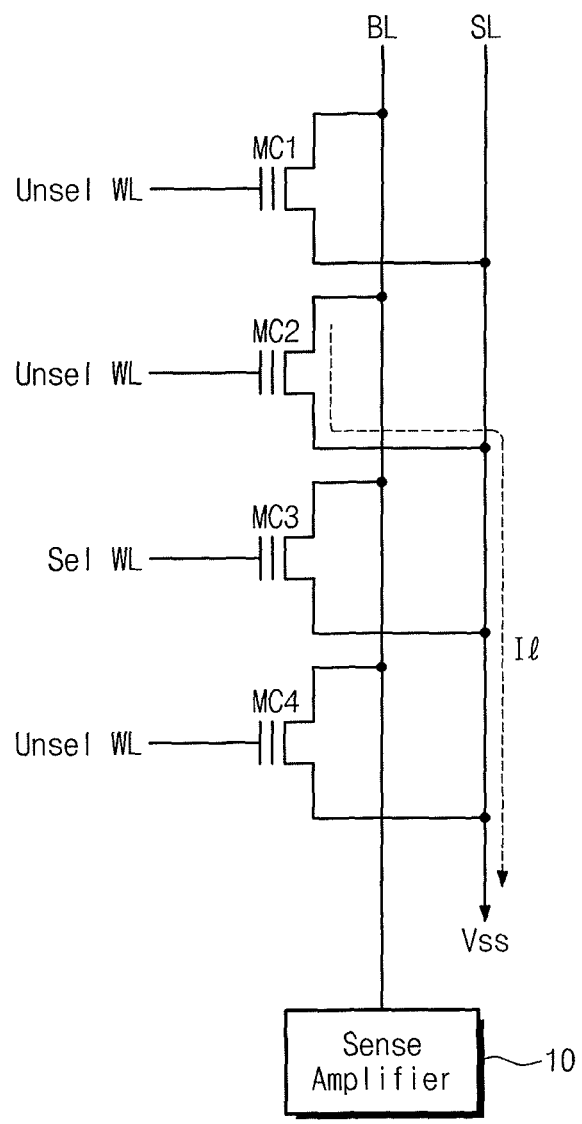
FIG. 1 is a circuit diagram illustrating a characteristic of a NOR type flash memory device.

FIG. 1 is a circuit diagram illustrating how an over-erased cell may affect a read operation of a NOR type flash memory device. Referring to FIG. 1, drains of memory cells (MC1-MC4) are connected to a bit line (BL) and sources of the memory cells (MC1-MC4) are connected to a source line (SL).

When performing a block erasure in a NOR type flash memory device, there may be an erasure speed difference between cells. Even if cells are erased in a same bias condition, some memory cells having a high erasure speed among the cells may be over erased. Through the drawing, it will be described how the flash memory device may be affected by the over-erased memory cells. A memory cell (MC2) is considered an over-erased cell. It is assumed that a memory cell (MC3) is programmed in a specific program state.

When a read operation of the memory cell (MC3) is performed, a read voltage (e.g., 5V) is applied to a word line (Sel WL) of the memory cell (MC3). A voltage of 0V is applied to unselected memory cells (MC1, MC2, MC4). At this time, a sense amplifier 10 detects data stored in the selected cell by detecting a current flowing through the selected memory cell.

However, as illustrated in FIG. 1, when an over-erased memory cell (MC2) is connected to the same bit line as the selected memory cell (MC3), an error may occur. The sense amplifier 10 may detect the selected memory cell (MC3) as an on-cell by a leakage current (Il) flowing through the over-erased even if the selected memory cell (MC3) is an off-cell. That is, a channel of the over-erased memory cell (MC2) should be in an off-state. However, a threshold voltage of the over-erased memory cell (MC2) is excessively low and thereby a leakage current (Il) flows through the channel of the over-erased memory cell (MC2).

The leakage current (Il) is provided from the bit line (BL) to detect the selected memory cell (MC3). The sense amplifier 10 should detect the selected memory cell (MC3) as an off-cell but may detect the selected memory cell (MC3) as an on-cell because of the leakage current (Il). The more the over-erased cell is, a read error caused by the leakage current (Il) may significantly occur.

Figure 2:
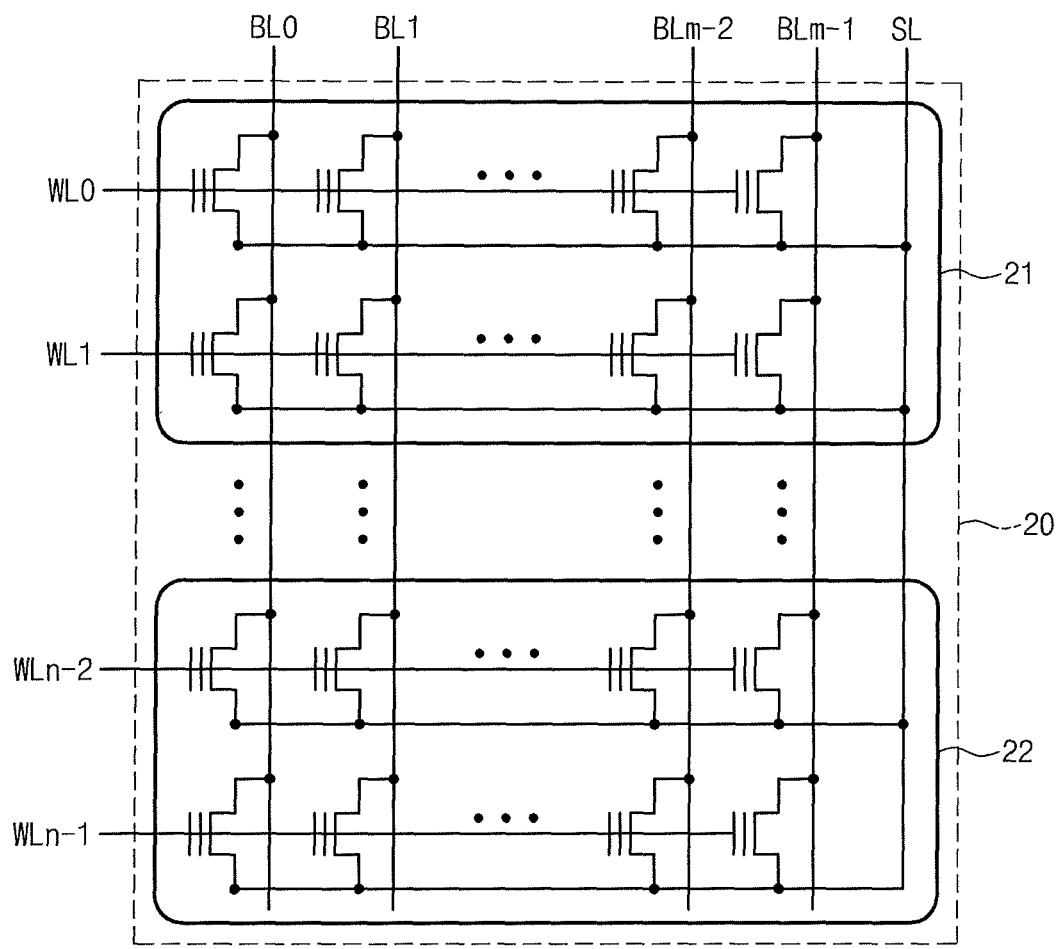
FIG. 2 is a circuit diagram illustrating a memory area of a NOR type flash memory device.

FIG. 2 is a circuit diagram illustrating a memory area (e.g., a sector or a memory block) of a NOR type flash memory device. Referring to FIG. 2, in a memory block 20 which is a unit of an erasure, the order of a program and a post-program may differ according to a disposal of word lines. When a post-program is performed, memory cells 22 are programmed relatively later compared with memory cells 21. When a post-program is performed, the memory cells 21 programmed first may greatly affected by over-erased cells compared with the memory cells 22 programmed later. This is because when the memory cells 21 are programmed, the rest of the memory cells exist in an erasure state. Over-erased memory cells may exist among the erased memory cells.

Thus, the amount of leakage currents (Il) expected when the memory cells 21 are programmed is greater than the amount of leakage currents (Il) expected when the memory cells 22 are programmed. In other words, when a post-program is performed, the effect of leakage current on the memory cells programmed first is different from the effect of leakage current on the memory cells programmed later. This means that a verification reading is not performed by the sense amplifier 10 in a same condition. Thus, a distribution of post-programmed memory cells may extend and thereby it may lead to an extension of erasure distribution.

An extension of erasure distribution may reduce a read margin and reliability of read operation. An erasure distribution should be managed to apply a multi-level cell (MLC).

Figure 3:
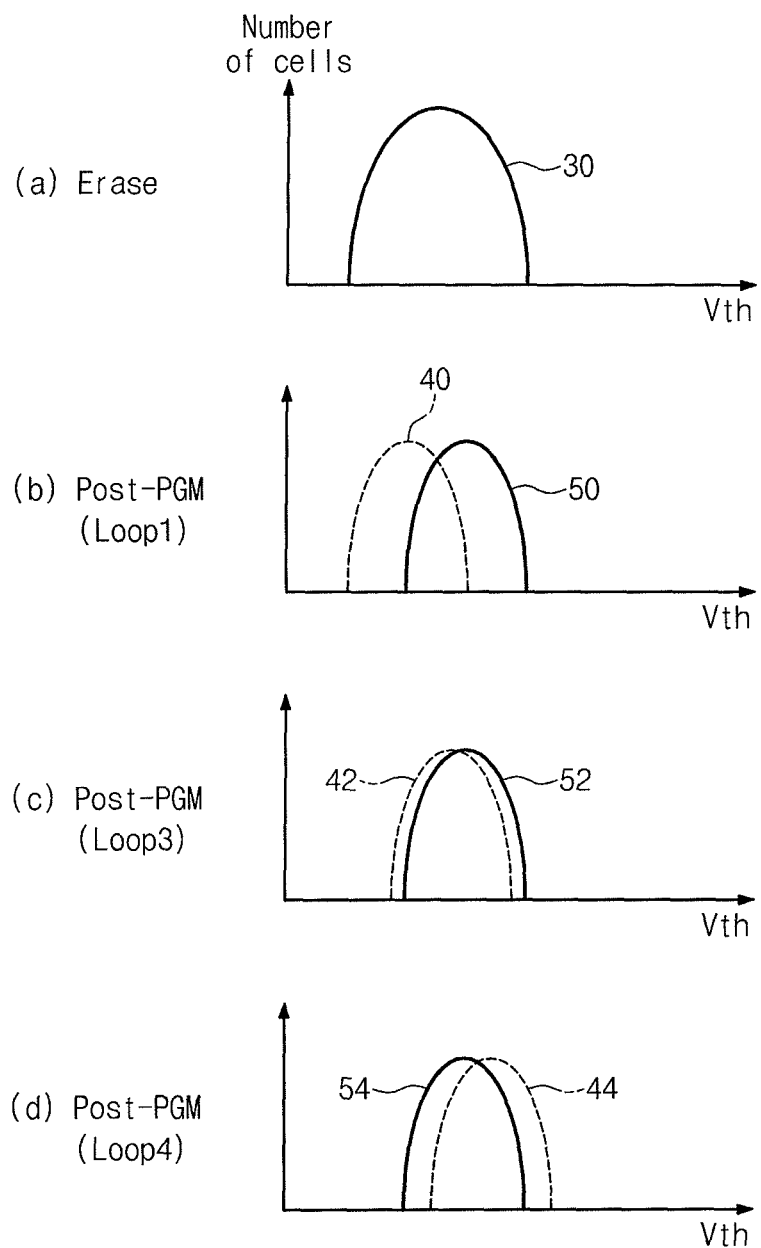
FIG. 3 is a drawing illustrating a process that memory cells are post-programmed.

FIG. 3 is a drawing illustrating a process that memory cells illustrated in FIG. 2 are post-programmed. Referring to FIG. 3, an erasure state 30 and distributions of memory cells in accordance with a progress of a post-program loop are illustrated in FIG. 3.

A (a) represents a distribution of the memory cells 20 of FIG. 2 included in one block formed by a block erasure. The distribution of memory cells formed by a block erasure is referred to as an erasure state 30. Distributions of memory cells appearing in each of post-program loops are illustrated in (b), (c) and (d).

The (b) represents a distribution of memory cells when a first loop (loop 1) is over. Each post-program loop may be executed by applying a program voltage to each word line of memory cells and performing a verification operation. At this time, the memory cells 21 of FIG. 2 programmed first among the selected memory cells may form a distribution 40. The memory cells 22 of FIG. 2 programmed later among the selected memory cells may form a distribution 50. This is because although the memory cells are post-programmed in a same bias condition, the memory cells 21 programmed first are greatly affected by a leakage current.

As illustrated in (c) and (d), as the number of post-programmed loops increases, the amount of leakage current is reduced. This is because the number of memory cells over-erased by a post-program. Thus, the distribution of memory cells 21 programmed first and the distribution of memory cells 22 programmed layer may be changed. That is, as the number of loops increases, the distribution of memory cells 21 programmed first will form distributions 42 and 44 and as the number of loops increases, the distribution of memory cells 22 programmed later will form distributions 52 and 54.

A distribution extension of when a post-program operation is performed was described. A distribution extension of memory cells caused by a post-program reduces reliability of an erasure operation. In a NOR type flash memory device in which a control of erasure distribution is important, it is difficult to expect improvements of read margin and reliability without an improvement of erasure distribution.

Figure 4:
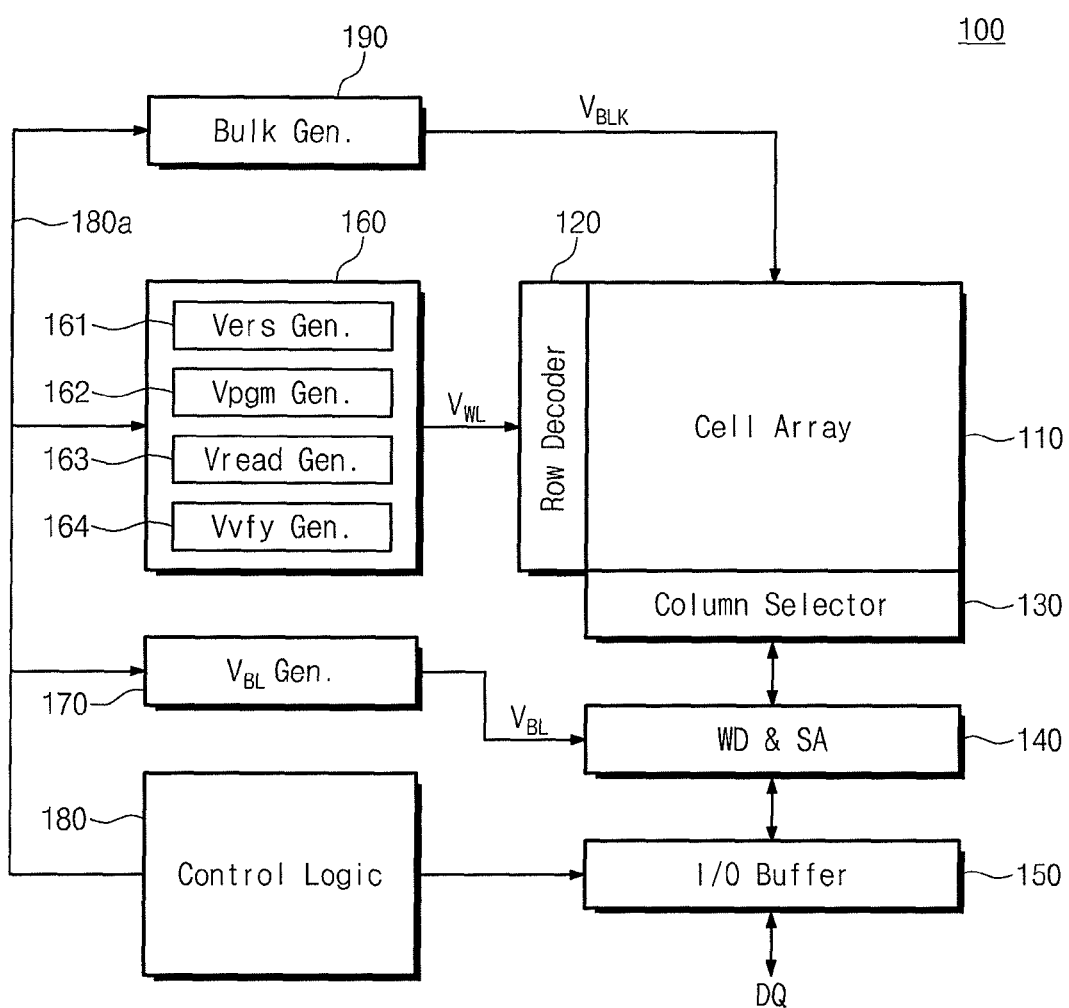
FIG. 4 is a block diagram illustrating a nonvolatile memory device of the inventive concept.

FIG. 4 is a block diagram explaining a nonvolatile memory device in accordance with an exemplary embodiment of the inventive concept. The nonvolatile memory device 100 may include a cell array 110, a row decoder 120, a column selector 130, a write driver and sense amplifier 140, an input/output buffer 150, a word line voltage generating circuit 160, a bit line voltage generating circuit 170, a bulk voltage generating circuit 190 and a control logic 180. The nonvolatile memory device 100 performs a two-step erasure operation including a block erasure operation and a selective erasure operation.

The cell array 110 may include a plurality of NOR type flash memory cells connected to a word line and a bit line respectively. The row decoder 120 selects one of a plurality of rows in response to a row address (not illustrated). The row decoder 120 transfers a word line voltage ($V_{WL}$) to a selected word line, where the word line voltage ($V_{WL}$) is supplied from the word line voltage generation 160. The word line voltage ($V_{WL}$) may have various voltage values according to operations. For example, The word line voltage ($V_{WL}$) may be about 5 V for a read operation; about 10V for a program operation; about −10 V for a block erasure operation. The word line voltage may further be 5~10V for a pre-program operation; 2~3 V for a post-program operation.

The column selector 130 selects a bit line in response to a column address (not illustrated). For a read operation, the column selector 130 connects a selected bit line to a sense amplifier of the write driver and sense amplifier 140. The sense amplifier detects data stored in the selected memory cell and transfers the detected result to the input/output buffer 150. For a program operation, the column selector 130 connects a selected bit line to a write driver of the write driver and sense amplifier 140. The write driver writes data provided from the input/output buffer 150 into the selected memory cell.

The write driver and sense amplifier 140 may further provide various bias voltages to a bit line according to an operation. For example, a selected bit line is set to a bias voltage of about 3~5V for a program operation; for a block erasure operation, selected bit lines may be set to be in a state of floating. For a post-erasure operation in accordance with the inventive concept, a selected bit line may be set to a bias voltage of about 5 V.

The input/output buffer 150 is connected to the write driver and sense amplifier. For a read operation, the input/output buffer 150, in response to control from the control logic 180, temporally stores sensed data from the memory array 110 and outputs the sensed data. For a program operation, the input/output buffer 150, in response to control from the control logic 180, temporally stores data received from a master device, and then transfers the data to the write driver and sense amplifier 140.

The word line voltage generating circuit 160, in response to a bias control signal (180a) from the control logic 180, provides a word line voltage ($V_{WL}$) to a selected word line. The word line voltage ($V_{WL}$) may have various bias voltages according to operation modes. The word line voltage generating circuit 160 may include an erasure voltage generator 161, a program voltage generator 162, a read voltage generator 163 and a verification voltage generator 164 that supply different the bias voltages according to operation modes respectively.

For example, for a block erasure operation, the erasure voltage generator 161 provides a negative voltage of about −10V to word lines of selected block; for a post-erasure operation and a write operation, the erasure voltage generator 161 also provides a negative voltage of about −10V to a word line of selected memory cell; for an incremental step pulse program (ISPP) operation, the program voltage generator 162 may provide an increasingly step-wise voltages to a selected memory cell; for a read operation, the read voltage generator 163 provides a read voltage of about 5V to a word line of selected memory cell; for a verification of programmed memory cells, the verification voltage generator 164 provides a verification voltage to a word line of programmed memory cell.

The bit line voltage generating circuit 170 provides a bit line voltage ($V_{BL}$) to a selected bit line according to a control signal (180b) of the control logic 180. The bit line voltage ($V_{BL}$) may have various bias voltages according to an operation mode. For example, for a read operation, the bit line voltage may be set to a bias voltage of about 1V; for a writing operation, the bit line voltage may be set to a bias voltage of about 5V; for a post-erasure operation, the bit line voltage may be set to a bias voltage of about 5V. The bit line voltages may be provided to a bit line by the write driver and sense amplifier 140.

The bulk voltage generating circuit 190, in response to a bias control signal (180a), may generate a bulk voltage ($V_{BLK}$) according to operation modes. For example, for block erasure operation, the bulk bias voltage ($V_{BLK}$) may be about 6~10V; for pre program and post-erasure operations, the bulk bias voltage ($V_{BLK}$) may be about 0 or −1V.

The control logic 180 controls the input/output buffer 150, the word line voltage generating portion 160 and the bit line voltage generating portion 170. When an erasure operation in accordance with the inventive concept is performed, the control logic 180 may perform two-step erasure operation including a block erasure operation and a selective erasure operation. The selective erasure operation is called a post-erasure operation. The two-step erasure operation will be explained in detail with reference to FIG. 5.

Figure 5:
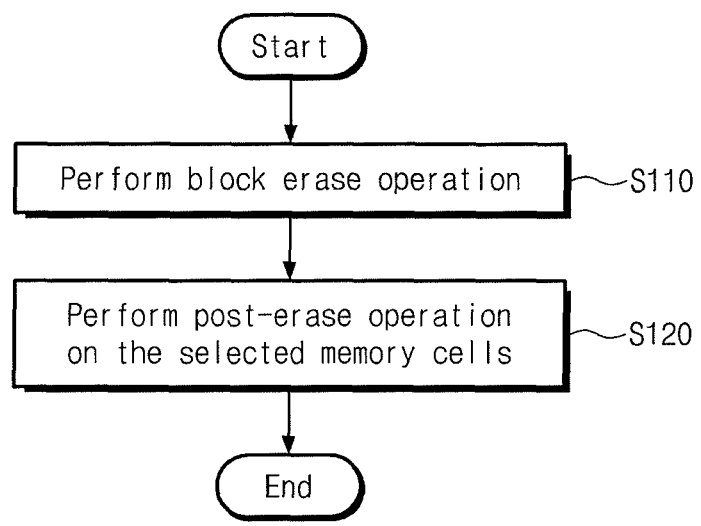
FIG. 5 is a flow chart illustrating an erasure method of the inventive concept.

FIG. 5 is a flowchart explaining a two-step erasure operation of the inventive concept. The control logic 180 performs an erasure operation including a pre-program step, a post-program step, and a two-step erasure operation. The two-step erasure operation includes a block erasure step S110 and a post-erasure step S120 as shown in FIG. 5. For a first step, S110, the control logic 180 performs a block erasure operation on a selected memory block. When a block erasure step is performed, memory cells included in the selected memory block are erased all at once. For the block erasure step of S110, the control logic 180 sets a bulk bias voltage ($V_{BLK}$) for a selected block to be 6V~10V and sets a word line voltage (VWL) to be −10V. The control logic 180 also sets a source line (SL) and bit lines (BL) of the selected memory block to be in a floating state. Under such bias condition, electrons in floating gates of memory cells in the selected block are pulled off to bulk region by a F-N tunneling mechanism. Before performing the step of S110, a pre-program operation may be performed on memory cells of selected block (or sector).

For a second step of S120, the control logic performs a post-erasure step on some of memory cells erased all at once. The nonvolatile memory device 100 selects and erases memory cells having a threshold voltage higher than a reference voltage (e.g., an erasure verification voltage Vev). To perform a post-erasure step, the control logic 180 performs a verification operation on memory cells included in the selected memory block. For example, the control logic 180 may perform a verification reading operation on the memory cells included in the selected memory block.

Memory cells having a threshold voltage higher than the erasure verification voltage Vev may be selected through the verification reading. The control logic 180 may temporally store addresses of the memory cells having a threshold voltage higher than the erasure verification voltage Vev. The control logic 180 may perform a post-erasure step, S120, on the memory cells selected through a verification reading. Unlike the block erasure step S110, a post-erasure step S120 performs a selective erasure operation on the selected memory cells. Thus, when a post-erasure step is performed, a bias condition different from when a block erasure operation is performed should be applied.

According to the two-step erasure method described above, when an erasure operation is performed, a problem of over-programmed memory cells being caused by a pre-program operation or a post-program operation may be solved. According to the inventive concept, an erasure distribution can be greatly improved, thereby obtaining a sensing margin for a read operation of nonvolatile memory devices.

Figure 6:
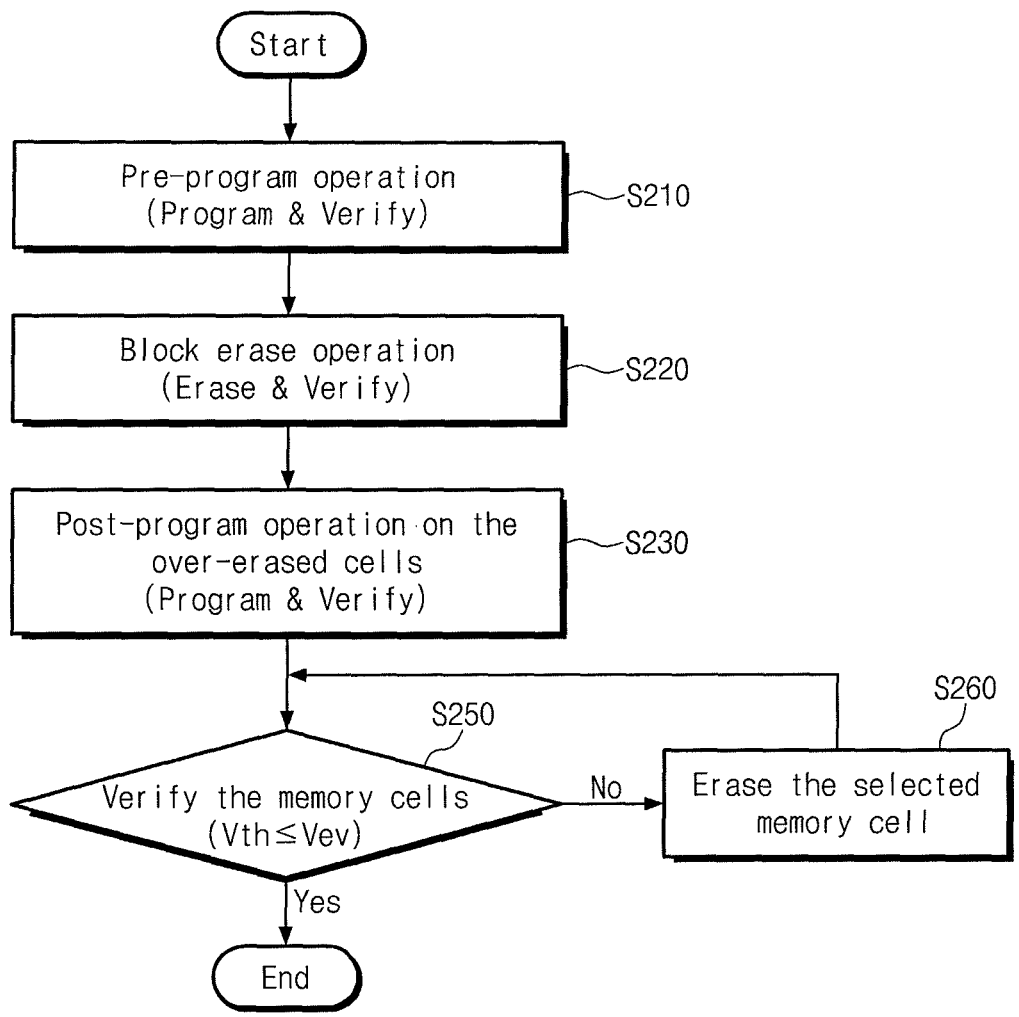
FIG. 6 is a flow chart illustrating a first embodiment of an erasure method of the inventive concept.

FIG. 6 is a flowchart for explaining a method of erasing a non volatile memory device according to a first embodiment of the inventive concept. The erasure method includes a post-erasure operation performed between step of a block erasure operation and step of a post-program operation. The erasure method will be explained using the nonvolatile memory device shown in FIG. 4. In a step of S210, the control logic 180 performs a pre-program operation on a selected memory block, supplying the same bias condition as that of a normal program operation. The pre-program operation is to prevent occurrence of over-erased memory cells when a subsequent block erasure operation is performed.

The pre-programmed operation may be performed row-by-row. For example, Memory cells having a same row address are selected and preprogrammed for a predetermined time, and then memory cells having a next row address is selected and pre-programmed for a predetermined time. All the memory cells of a selected block are pre-programmed through that process. The pre-programmed operation, S210, may shift threshold voltages of memory cells to an off state, where floating gates of memory cells are filled with electrons by a hot-carrier injection.

In step of S220, a block erasure operation is performed for a predetermined time, where all pre-programmed memory cells in a selected block is erased all at once by an F-N tunneling effect. For the block erasure operation, bias voltages of about 6V~10V and about −10V are respectively applied to a bulk and word lines of the memory block selected according to a control of the control logic 180. Under such bias condition, there is a potential difference between channels in the bulk and control gates connected to the word lines and as a result, a strong electric field is formed in floating gates of all the memory cells in the selected memory block. The electric field induces a F-N tunneling effect, where electrons stored in the floating gates are pulled off and move to channels. After the predetermined time, the control logic performs an erasure verification operation to determine whether threshold voltages of memory cells have a threshold voltage distribution E1 of which upper bound value is equal to or lower than an upper bound erasure verification voltage (Vev). The erasure verification voltage (Vev) is an upper bound of a desired threshold voltage distribution that memory cells have after an erasure operation is completed.

In step of S230, the control logic 180 performs a post-program operation on over-erased memory cells. The control logic 180 performs a verification operation using the erasure verification voltage (Vev) to select over-erased memory cells. The control logic 180 programs the selected over-erased memory cells. The control logic 180 sequentially programs the selected over-erased memory cells with reference to address information of the selected over-erased memory cells.

After programming the selected over-erased memory cells, a verification operation is performed to verify whether threshold voltages of the over-erased memory cells are shifted over a lower bound verification voltage (Voev). The lower bound verification voltage (Voev) is a lower bound of a desired threshold voltage distribution that memory cells have after an erasure operation is completed. When a memory cell have a threshold below the lower bound verification voltage (Voev), the control logic 180 repeats a post-program operation until the memory cell has a threshold voltage over the verification voltage (Voev). In the case that all the threshold voltages of the selected memory cells are higher than the lower bound erasure verification voltage (Voev), the control logic proceeds to step of S250.

In the step of S250, the control logic 180 performs a verify operation using an upper bound erasure verification voltage (Vev) to select memory cells for a selective erasure operation, S260. For example, if a selected memory cell has a threshold voltage higher than the second erasure verification voltage (Vev), the control logic performs steps of S260 and S250 until the threshold voltage shifts to one that equals to or is lower than the upper erasure verification voltage (Vev). If all the threshold voltages of memory cells have the desired threshold voltage, an erasure operation is completed.

In the step of S260, the control logic 180 selectively erases the memory cell of which threshold voltage is determined to be higher than the erasure verification voltage (Vev). For the selective erasure operation, its bias condition may be set to induce a negative gate drain side erasure (NGDE) mechanism, which is a reverse operation of hot electron injection and different erase mechanism for the block erasure operation, S220, using a F-N tunneling mechanism. For example, bias voltages for a word line, a bit line, a bulk region for the memory cell are a negative voltage of −10V, +5V, and 0V, respectively. Under such bias condition, electrons in the floating gate may be pulled off to the drain region.

After performing the erasure operation S260 for a predetermined time, the control logic 180 moves to a step of S250 to verify whether the threshold voltage of the selected memory cell shifts to a desired threshold voltage. The desired threshold voltage may be one equal to or lower than an upper erasure verification voltage (Vev). If the selected memory cell has a threshold voltage higher than the erasure verification voltage (Vev), the control logic 180 repeats the steps 250 and S260 until the threshold voltage of the selected memory cell shifts to the desired threshold voltage. In the step of S260, memory cells having threshold voltages higher than the erasure verification voltage (Vev) are selected and an erasure operation may be performed on the selected memory cells again by the NGDE method. If all the threshold voltages of the post-erased memory cells are equal to or lower than the erasure verification voltage (Vev), the control logic 180 completes a erasure operation.

Herein, the steps of 250 and 260 constituting a loop may correspond to a post-erasure operation. An over-program problem being caused by a process of a pre-program or a post-program may be solved through the post-erasure.

Figure 7:
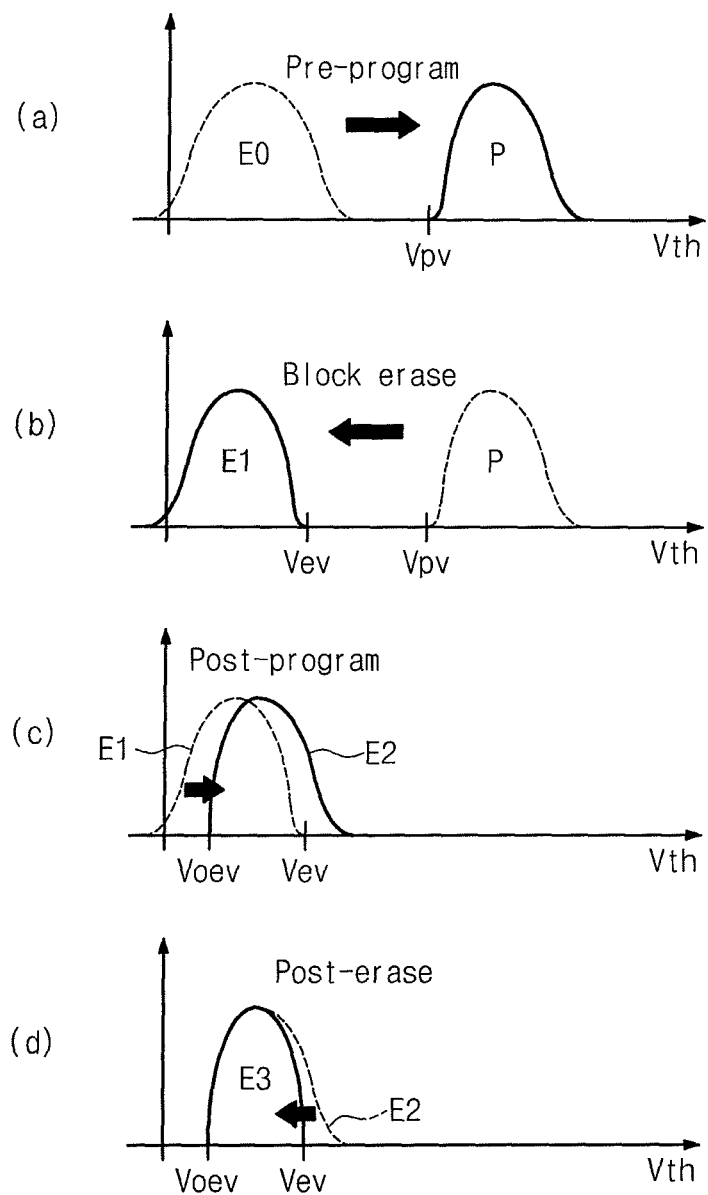
FIG. 7 is a drawing illustrating a distribution change of memory cells in accordance with the inventive concept.

FIG. 7 shows threshold voltage distributions for nonvolatile memory cells according to the erasure operation of FIG. 6. FIG. 7 (a) is a resultant threshold voltage distribution of memory cells after a pre-program operation is performed; (b) is a resultant threshold voltage distribution after a block erasure operation is performed; (c) is a resultant threshold voltage distribution after a post-program operation is performed; (d) is a resultant threshold voltage distribution after a post-erasure operation is performed. Each resultant distribution will be described below in detail.

For the pre-program operation of the step of S210, memory cells may have a threshold distribution as shown in FIG. 7 (a). All the memory cells have a threshold voltage in a threshold voltage distribution corresponding to a program state (P).

Figure 14:
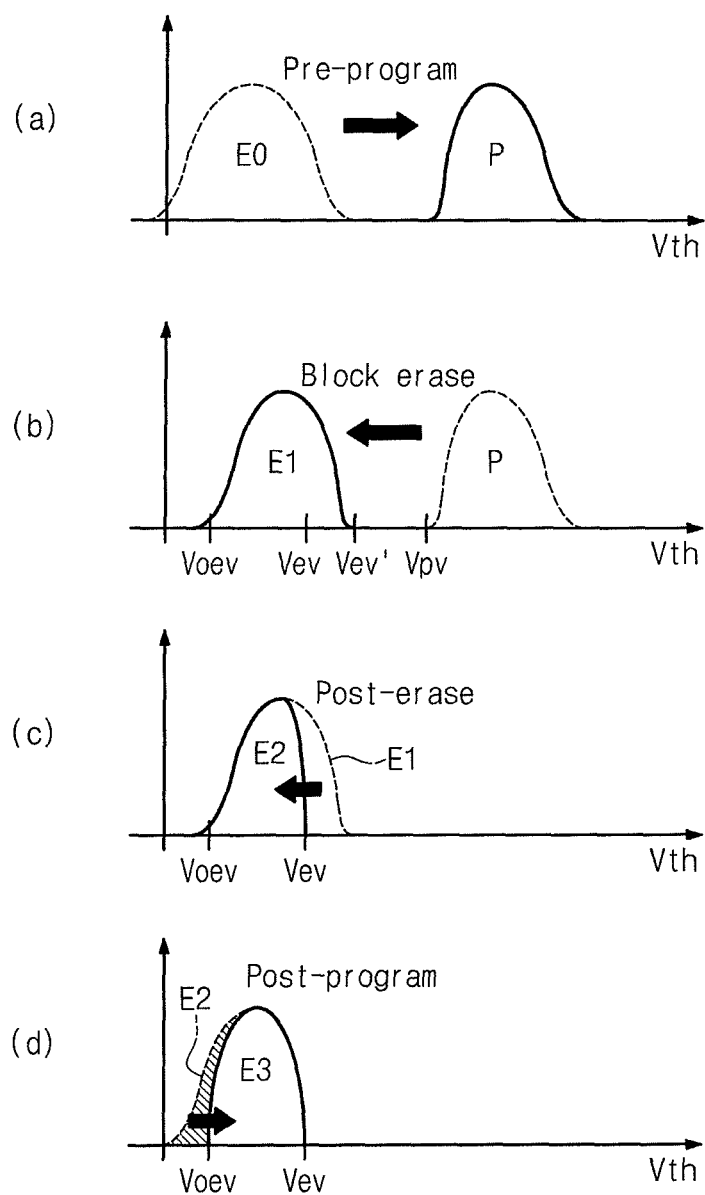
FIG. 14 is a drawing illustrating a distribution change of memory cells in the erasure method in accordance with the second embodiment of the inventive concept.

For the block erasure operation of the step of S220, memory cells may have a threshold voltage distribution as shown in FIG. 14 (b). For simplicity of explanation, it is desired that memory cells have threshold voltages between an upper bound verification voltage Voev and a lower bound verification voltage Vev after the erasure operation explained in FIG. 5 has completed. The block erasure operation is performed using an upper bound verification voltage (Vev). The resultant threshold distribution (E1) has an lower tail that runs between Voev and Vev, whose threshold voltage are in a state of being over-erased.

For the post-program operation of the step of S230, memory cells may have a resultant threshold voltage distribution (E2), drawn in a solid line, as shown in (c) of FIG. 7. The post-program operation may shift threshold voltages of memory cells in the lower tail of E1 distribution so that the memory cells have threshold voltages equal to or higher than a lower bound verification voltage (Voev). The threshold voltage shift may be achieved by using selectively programming over-programmed memory cells in the bias condition which induces a hot carrier injection into floating gates of the memory cells.

For the post-erasure operation of the steps of S250 and S260, memory cells may have a resultant threshold voltage distribution (E3), drawn in a solid line, as shown in (d) of FIG. 7. The post-erasure operation may shift threshold voltages of memory cells in the upper tail of E2 distribution so that the memory cells have threshold voltages equal to or lower than an upper bound verification voltage (Vev). The threshold voltage shift may be achieved by using selectively erasing over-programmed memory cells in the bias condition which induces a NGDE mechanism.

FIG. 8 is a table illustrating a bias condition in accordance with the first embodiment of the inventive concept. For a pre-program operation S210, a bias condition is listed in row (a) of the table. A word line voltage (VWL) for a selected word line may be 5~10V; a bit line voltage (VBL), 3~5V; a source line (SL), grounded; a bulk bias voltage ( ), 0 or −1V. This bias condition may induce the selected memory cells to be programmed by a hot electron injection effect.

For a block erasure operation S220, a bias condition is listed in row (b) of the table. A word line voltage (VWL) for a selected word line may be set to −10V; a bit line voltage (VBL), a floating state; a source line (SL), a floating state; a bulk bias voltage ( ), 6~10V. Under such bias condition, electrons trapped in the floating gate are pulled off to a body region by an F-N tunneling mechanism.

For a post-program operation S230, a bias condition is listed in row (c) of the table. A word line voltage (VWL) for a selected word line may be set to 2~3V; a bit line voltage (VBL), 3~5V; a source line (SL), ground; a bulk bias voltage ( ), 0 or −1V. In this bias condition, the selected memory cells will be programmed to have a threshold voltage higher than the lower bound verification voltage (Voev).

For a post-erasure operation S250 and S260, a bias condition is listed in row (d) of the table. A word line voltage (VWL) for a selected word line may be set to −10V; a bit line voltage (VBL), 5V; a source line (SL), a floating state; a bulk bias voltage ( ), 0V. In this bias condition, the selected memory cells will be programmed to have a threshold voltage lower than the upper erasure verification voltage (Vev) using a negative gate drain side erasure (NGDE) mechanism. The NGDE mechanism is a reverse operation of hot electron injection and different erase mechanism for the block erasure operation, S220, using a F-N tunneling mechanism. For example, bias voltages for a word line, a bit line, a bulk region for the memory cell are a negative voltage of −10V, +5V, and 0V, respectively. Under such bias condition, electrons in the floating gate may be pulled off to the drain region.

According to the bias condition described above, when a post-erasure operation is performed, a selective erasure can be performed on memory cells having a threshold voltage higher than the upper bound verification voltage (Vev).

FIGS. 9 through 12 are drawings illustrating an operation mechanism of an erasure operation in accordance with the inventive concept. FIGS. 9 through 12 describe a pre-program operation, a block erasure operation, a post-program operation and a post-erasure operation, respectively.

Figure 9:
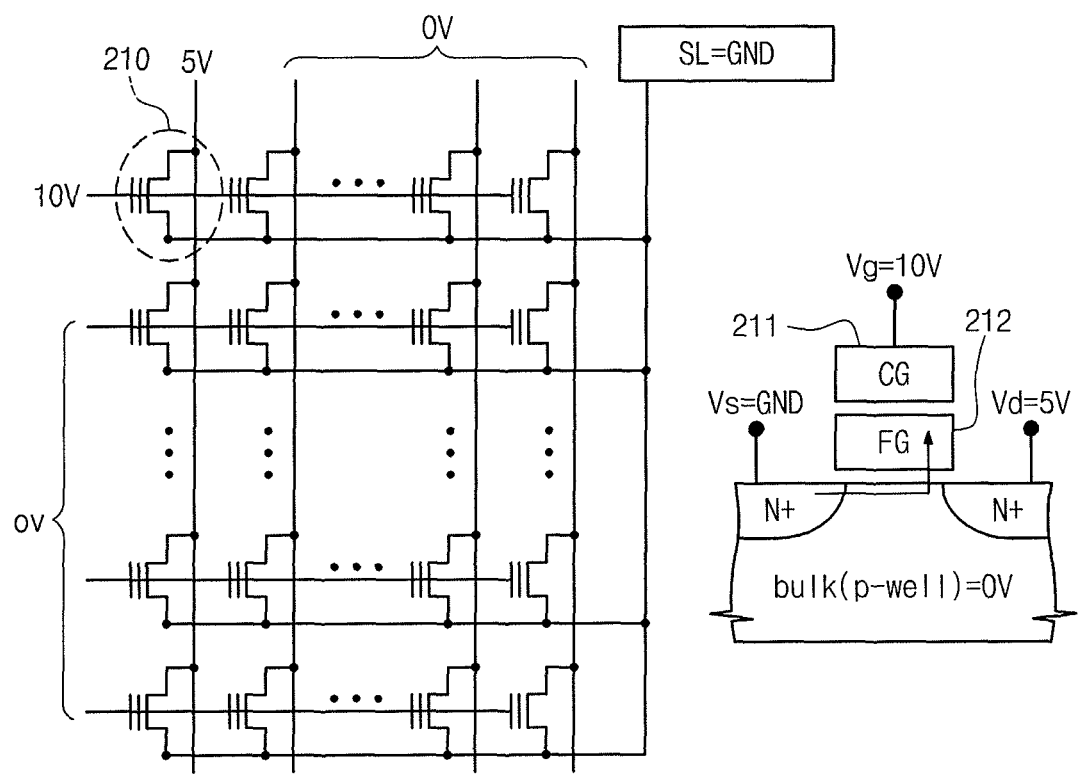
FIGS. 9 through 12 are drawings illustrating an operation characteristic of each process in an erasure operation in accordance with the inventive concept.

Referring to FIG. 9, it is assumed that a memory cell 210 is selected for a pre-program. Bias conditions for pre-programming the memory cell 210 are illustrated in a circuit diagram on the left and a cross sectional structure of the memory cell 210 on the right. When a pre-program operation is performed, a voltage of 10V is applied to a word line of the selected memory cell 210. A voltage of about 5V is applied to a bit line of the selected memory cell 210. A source line (SL) of the selected memory sell 210 is grounded and a voltage of 0V (or −1V) is applied to a bulk region of the selected memory cell. A voltage of 0V may be applied to unselected word lines and bit lines.

In this bias condition, an electric field is formed between a control gate 211 of the selected memory cell 210 and a channel of the selected memory cell 210. Such electric field may generate channel hot electrons flowing through the channel and inject the electrons into a floating gate 212. The injected electrons in the floating gate 212 may shift a threshold of the memory cell 212 to be in the threshold voltage distribution (P) as shown in FIG. 7 (a).

Figure 10:
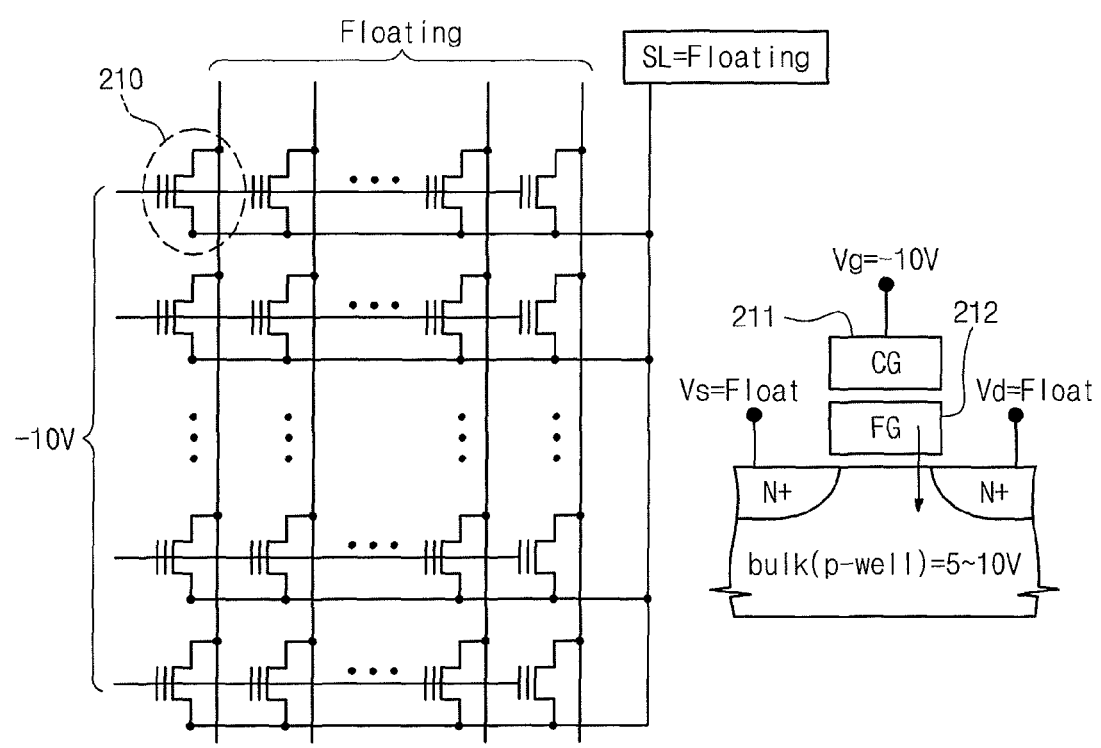

Referring to FIG. 10, bias conditions for a block-erasure operation of the memory cell 210 are illustrated in a circuit diagram on the left and a cross sectional structure of the memory cell 210 on the right. A high voltage of 5V~10V is applied to the bulk region and a voltage of about −10V is applied to the word lines of the memory cells. Bit lines and word lines of memory cells maintain a floating state. Under such bias conditions, electrons injected into the floating gate 212 are removed by an F-N tunneling mechanism.

Figure 11:
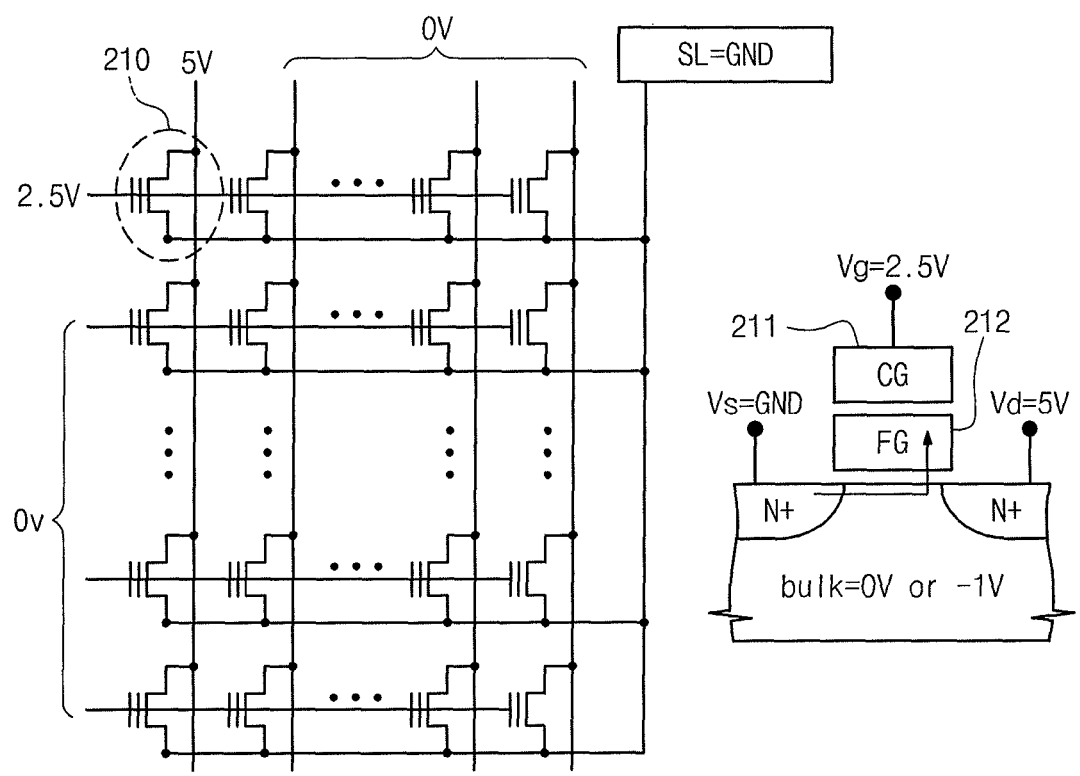

Referring to FIG. 11, bias conditions for a post-program operation of the memory cell 210 are illustrated in a circuit diagram on the left and a cross sectional structure of the memory cell 210 on the right. The source line (SL) of the memory cell 210 selected for a post-program is grounded. A voltage of about 2.5V is applied to the word line of the selected memory cell 210. A voltage of about 5V is applied to the bit line of the selected memory cell 210. A voltage of 0V (or −1V) is applied to the bulk region. In this bias condition, the selected memory cell 210 is programmed to have a threshold voltage higher than a lower bound verification voltage (Voev). When a post-program operation is performed, a word line voltage lower than the word line voltage for a pre-program operation is performed is applied. Thus, a post-program operation is performed with a lower program speed than a pre-program operation is performed.

Figure 12:
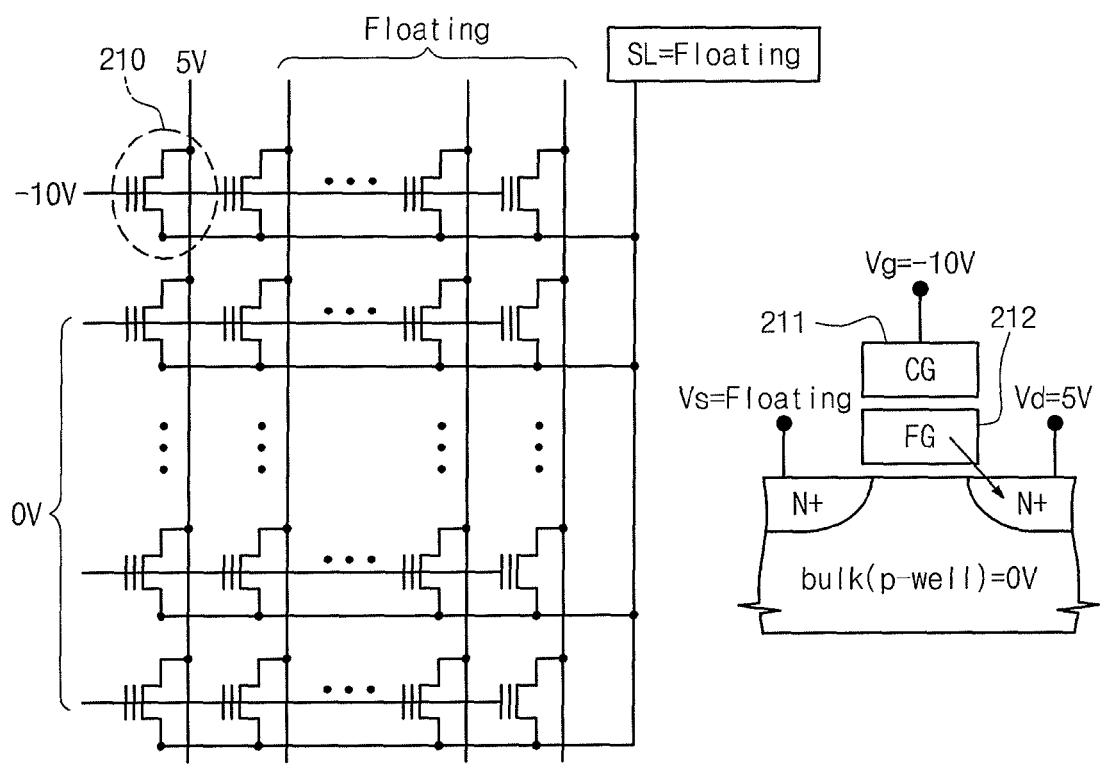

Referring to FIG. 12, bias conditions for a post-program operation of the memory cell 210 are illustrated in a circuit diagram on the left and a cross sectional structure of the memory cell 210 on the right. When a post-erasure operation is performed, the source line (SL) of the selected memory cell 210 is in a floating state. A voltage of about −10V is applied to the word line of the selected memory cell 210. A voltage of about 5V is applied to the bit line of the selected memory cell 210. A voltage of 0V (or −1V) is applied to the bulk region. A voltage of 0V is applied to word lines of unselected memory cells and bit lines of unselected memory cells are in a floating state. In this bias condition, the selected memory cell 210 is erased to have a threshold voltage lower than the upper bound erasure verification voltage (Vev) under a negative gate drain side erasure (NGDE) mechanism. That is, electrons injected into the floating gate 212 of the selected memory cell 210 may be pulled off the floating gate 212 and move to a drain (or bit line) of the selected memory cell 210.

Figure 13:
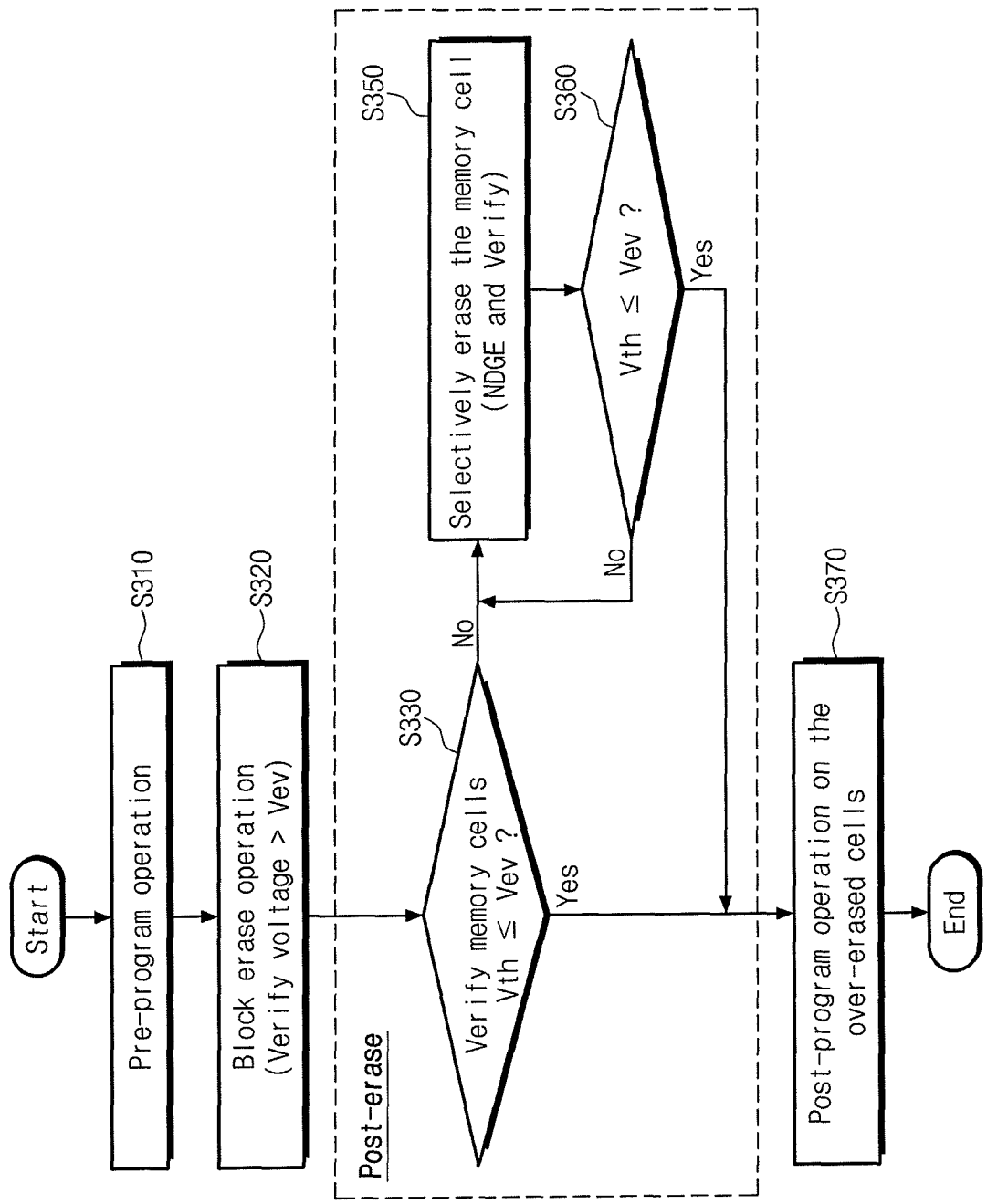
FIG. 13 is a flowchart for explaining a method of erasing a nonvolatile memory device according to a second embodiment off the inventive concept.

FIG. 13 is a flowchart for explaining a method of erasing a non volatile memory device according to a second embodiment of f the inventive concept. The erasure method includes a post-erasure operation performed between step of a block erasure operation and step of a post-program operation. The erasure method will be explained using the nonvolatile memory device shown in FIG. 4.

In step of S310, the control logic 180 performs a pre-program operation on a selected memory block, supplying the same bias condition as that of a normal program operation. The pre-program operation is to prevent occurrence of over-erased memory cells when a subsequent block erasure operation is performed.

In step of S320, a block erasure operation is performed for a predetermined time, where all pre-programmed memory cells in a selected block is erased all at once by an F-N tunneling effect. For the block erasure operation, bias voltages of about 6V~10V and about −10V are respectively applied to a bulk and word lines of the memory block selected according to a control of the control logic 180. Under such bias condition, there is a potential difference between channels in the bulk and control gates connected to the word lines and as a result, a strong electric field is formed in floating gates of all the memory cells in the selected memory block. The electric field induces a F-N tunneling effect, where electrons stored in the floating gates are pulled off and move to channels. After the predetermined time, the control logic performs an erasure verification operation to determine whether threshold voltages of memory cells are shifted to ones more than a first erasure verification voltage (Vev'). The first erasure verification voltage (Vev') for the erasure verification is provided to be higher than the erasure a second verification voltage (Vev) for step S330, which will be explained below. In the step of S340, the control logic 180 performs a verify operation using a second erasure verification voltage (Vev) to select memory cells for a selective erasure operation, S350. For example, if a selected memory cell has a threshold voltage higher than the second erasure verification voltage (Vev), the control logic performs steps of S350 and S 360 until the threshold voltage shifts a desired threshold voltage, equal to or lower than the second erasure verification voltage (Vev). If all the threshold voltages of memory cells have the desired threshold voltage, the control logic 80 performs a step of a post-program operation, S370.

In the step of S350, the control logic 180 selectively erases the memory cell of which threshold voltage is determined to be higher than the erasure verification voltage (Vev). For the selective erasure operation, its bias condition may be set to induce a negative gate drain side erasure (NGDE) mechanism, which is a reverse operation of hot electron injection and different erase mechanism for the block erasure operation, S320, using a F-N tunneling. For example, bias voltages for a word line, a bit line, a bulk region for the memory cell are a negative voltage of −10V, +5V, and 0V, respectively. Under such bias condition, electrons in the floating gate may be pulled off to the drain region.

After performing the erasure operation S350 for a predetermined time, the control logic 180 moves to a step of S360 to verify whether the threshold voltage of the selected memory cell shifts to a desired threshold voltage. The desired threshold voltage may be one equal to or lower than the second erasure verification voltage (Vev). If the selected memory cell has a threshold voltage higher than the erasure verification voltage (Vev), the control logic 180 repeats the steps 350 and S360 until the threshold voltage of the selected memory cell shifts to the desired threshold voltage. In the step of S350, memory cells having threshold voltages higher than the erasure verification voltage (Vev) are selected and an erasure operation may be performed on the selected memory cells again by the NGDE method. If all the threshold voltages of the post-erased memory cells are equal to or lower than the erasure verification voltage (Vev), the control logic 180 performs a post-program operation, S370.

In the step of S370, the control logic 180 performs a post-program operation on over-erased memory cells. The control logic 180 performs a verification operation using the over-erasure verification voltage (Voev) to select over-erased memory cells. The control logic 180 selectively programs the selected over-erased memory cells. The control logic 180 sequentially programs the selected memory cells with reference to address information of the selected memory cells. When a post-program operation on the selected memory cells is completed, all the erasure operations are completed.

FIG. 14 shows threshold voltage distributions for nonvolatile memory cells according to the erase operation. Referring to FIG. 14, (a) is a resultant threshold voltage distribution of memory cells after a pre-program operation is performed; (b) is a resultant threshold voltage distribution after a block erasure operation is performed; (c) is a resultant threshold voltage distribution after a post-erasure is performed; (d) is a resultant threshold voltage distribution after a post-program is performed. Each resultant distribution will be described with reference to FIG. 14 in detail.

For the pre-program operation of the step of S310, memory cells may have a threshold distribution as shown in (a) of FIG. 14. All the memory cells have a threshold voltage in the distribution corresponding to a program state (P).

For the block erasure operation of the step of S320, memory cells may have a threshold distribution as shown in (b) of FIG. 14. For simplicity of explanation, it is desired that memory cells have threshold voltages between Voev and Vev after the erase operation has completed. The block erasure operation is performed using a first verification voltage (Vev'), the resultant threshold distribution (E1) has an upper tail that runs between Vev and Vev', whose threshold voltage are in a state of being over-programmed; a lower tail that run below Voev, of which threshold are in a state of being over-erased. The erasure verification voltage (Vev') is higher than the upper level (Vev) of a desired threshold distribution.

For the post-erasure operation of the step of S350, memory cells may have a threshold voltage distribution (E2), drawn in a solid line, as shown in (c) of FIG. 14. The post-erasure operation may shift threshold voltages of memory cells in the upper tail of E1 distribution and thus the resultant distribution (E2) may have a new upper most threshold voltage (Vev). The threshold shift may be achieved by using selectively erasing over-programmed memory cells in the bias condition which induces a NGDE mechanism.

For the post-program operation of the step of S370, memory cells may have a threshold voltage distribution (E3), drawn in a solid line, as shown in (d) of FIG. 14. The post-program operation may shift threshold voltages of memory cells in the lower tail of E2 distribution and thus the resultant distribution (E3) may have a new lower least threshold voltage (Voev). The threshold shift may be achieved by using selectively programming over-programmed memory cells in the bias condition which induces a hot carrier injection into floating gates of the memory cells.

Figures 15, 16:
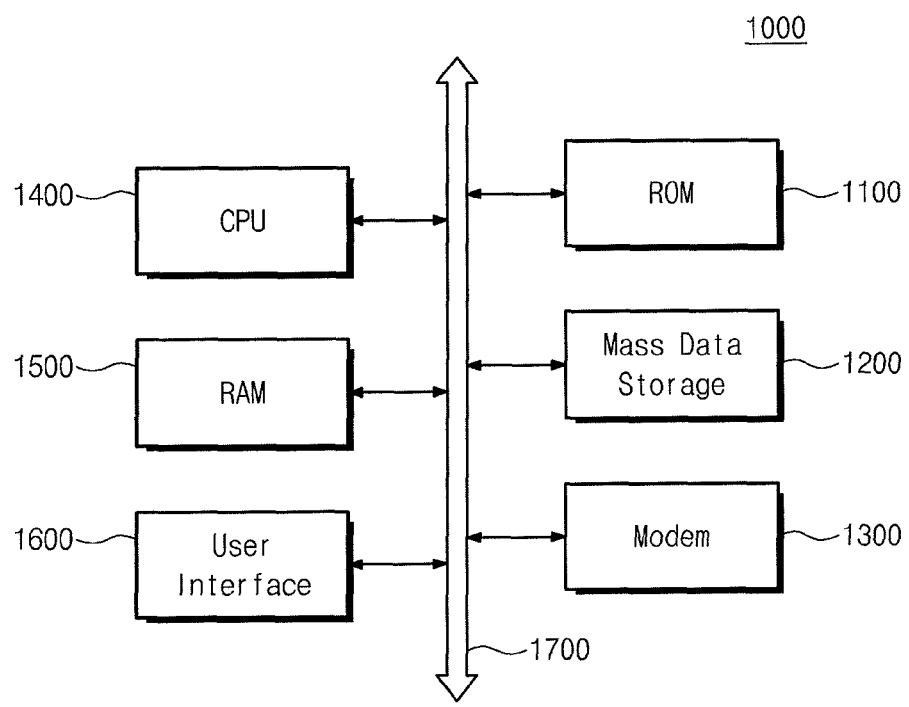
FIG. 15 is a table illustrating a bias condition in the erasure method in accordance with the second embodiment of the inventive concept.
FIG. 16 is a block diagram illustrating a computing system using the nonvolatile memory device of the inventive concept as a ROM.

FIG. 15 is a table illustrating a bias condition in accordance with the second embodiment of the inventive concept. The bias condition in the second embodiment is the substantially same as the bias condition in the first embodiment and thereby a detailed description is omitted.

FIG. 16 is a block diagram illustrating an application of the nonvolatile memory device of the inventive concept. Referring to FIG. 16, a computing system 1000 using the nonvolatile memory device of the inventive concept as a ROM 1100 is illustrated. The computing system 1000 in accordance with the inventive concept may include a nonvolatile memory device 1100, a mass data storage 1200, a modem 1300 such as a baseband chipset, a central processing unit (CPU) 1400, a RAM 1500, a user interface 1600 that are electrically connected to a system bus 1700.

If the computing system 1000 is a mobile device, a battery (not illustrated) for supplying an operation voltage of the computing system 1000 may be further provided. Although not illustrated in the drawing, the computing system 1000 may further include an application chipset, a camera image processor (CIS), etc.

Herein, the ROM 1100 may be used as code storage of the computing system 1000. The ROM 1100 constituted by the nonvolatile memory device of the inventive concept may provide code data having high reliability. Thus, code data having high reliability can be provided, thereby improving operation reliability of the computing system 1000.

The nonvolatile memory device in accordance with the inventive concept can be mounted with various types of packages. For example, the nonvolatile memory device can be mounted by various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP) and mounted.

According to the nonvolatile memory device and the erasure method thereof in accordance with the inventive concept, an erasure distribution of memory cells may be accurately controlled. Thus, a read margin of the nonvolatile memory device may be greatly improved.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method in performing an erasure operation of a nonvolatile memory device, comprising:

a step of performing a block erasure operation wherein a plurality of memory cells in a selected block are erased at once;
a step of selecting an over-programmed memory cell having a threshold voltage higher than an upper bound verification voltage; and
a step of erasing selectively the over-programmed memory cell.

2. The method in performing an erasure operation of claim 1, wherein the step of erasing selectively the over-programmed memory cell includes applying a negative high voltage to a word line of the selected over-programmed memory cell and a positive high voltage to a bit line of the selected over-programmed memory cell so that electrons stored in a floating gate of the selected over-programmed memory cell are pulled off to a drain of the over-programmed memory cell.

3. The method in performing an erasure operation of claim 2, wherein a source line of the selected memory cell is in a floating state.

4. The method in performing an erasure operation of claim 1, further comprising a step of selecting an over-erased memory cell having a threshold voltage lower than a lower bound verification voltage and a step of programming the over-erased memory cell before the step of erasing selectively the over-programmed memory cell.

5. The method in performing an erasure operation of claim 4, wherein the upper bound verification voltage corresponds to an erasure verification voltage used in the step of performing the block erasure operation.

6. The method in performing an erasure operation of claim 5, wherein the step of selecting the over-programmed memory cell further comprises a step of verifying the plurality of memory cells using the upper bound verification voltage.

7. The method in performing an erasure operation of claim 6, wherein the step of erasing selectively the over-programmed memory cell further comprises a step of verifying that the over-programmed memory cell has a threshold voltage equal to or less than the upper bound verification voltage wherein the step of erasing selectively the over-programmed memory cell repeats until the over-programmed memory cell has a threshold voltage equal to or lower than the upper bound verification voltage.

8. The method in performing an erasure operation of claim 1, further comprising a step of selecting an over-erased memory cell having a threshold voltage lower than a lower bound verification voltage and a step of programming the over-erased memory cell after the step of erasing selectively the over-programmed memory cell.

9. The erasure method of claim 8, wherein a verification voltage of the block erasure operation is higher than the upper verification voltage.

10. The method in performing an erasure operation of claim 9, wherein the step of erasing selectively the over-programmed memory cell further comprises a step of verifying that the over-programmed memory cell has a threshold voltage equal to or less than the upper bound verification voltage wherein the step of erasing selectively the over-programmed memory cell repeats until the over-programmed memory cell has a threshold voltage equal to or lower than the upper bound verification voltage.

11. The method in performing an erasure operation of claim 1, further comprising a step of pre-programming the selected plurality of memory cells before the step of performing the block erasure operation.

12. A nonvolatile memory device comprising:
a cell array comprising a plurality of memory cells wherein the memory cells have a desired threshold voltage distribution for a state of being erased, wherein the distribution spreads over between a lower bound verification voltage and an upper bound verification voltage;
a voltage generator configured to provide a word line voltage and a bit line voltage to word lines and bit lines of the plurality of memory cells respectively;
a write driver and sense amplifier configured to write data or read out data through bit lines of the plurality of memory cells; and
a control logic configured to control the voltage generator and the write driver and sense amplifier to perform a post-erasure operation of selecting and erasing an over-programmed memory cell having a threshold voltage higher than the upper bound verification voltage.

13. The nonvolatile memory device of claim 12, wherein when the post-erasure operation is performed, the control logic controls the voltage generator and the write driver and sense amplifier so that a negative high voltage is applied to a word line of the over-programmed memory cell and a positive high voltage is applied to the bit line of the over-programmed memory cell.

14. The nonvolatile memory device of claim 13, wherein the control logic further controls the voltage generator and the write driver and sense amplifier so that a source line of the over-programmed memory cell is set to be in a floating state and a voltage of 0V or a negative voltage is applied to a bulk region of the over-programmed memory cell.

15. A nonvolatile memory device comprising:
a memory cell array comprising a plurality of memory cells wherein the memory cells have a desired threshold voltage distribution for a state of being erased, wherein the distribution spreads over between a lower bound verification voltage and an upper bound verification voltage;
a voltage generator configured to supply bias voltages for an erasure operation of the memory cells; and
a control logic configured to control the voltage generator and to perform the erasure operation including a pre-program operation, a post-program operation, and a two-step erasure operation so that the memory cells have the desired threshold voltage distribution for a state of being erased.

16. The nonvolatile memory device of claim 15, the two-step erasure operation includes a block erasure operation and a post-erasure operation wherein for the block erasure operation, the control logic sets the voltage generator to erase memory cells in a selected block by a F-N tunneling erasure mechanism and for an over-programmed memory cell having the upper bound verification voltage, the control logic sets the voltage generator to selectively erases the over-programmed memory cell by a negative gate drain side erasure mechanism.

17. The nonvolatile memory device of claim 16, wherein the erasure operation is performed in a sequence of the pre-program operation, the block erasure operation, the post-program operation, and the post-erasure operation.

18. The nonvolatile memory device of claim 17, wherein the controller logic further performs a verifying operation using a reference voltage higher than the upper bound verification voltage for the block erasure operation.

19. The nonvolatile memory device of claim 16, wherein the erasure operation is performed in a sequence of the pre-program operation, the block erasure operation, the post-erasure operation, and the post-program operation.

20. The nonvolatile memory device of claim 19, wherein the controller logic further performs a verifying operation using a reference voltage equal to the upper bound verification voltage for the block erasure operation.

* * * * *